United States Patent [19]

Misawa et al.

[11] Patent Number: 6,150,725
[45] Date of Patent: Nov. 21, 2000

US006150725A

[54] SEMICONDUCTOR DEVICES WITH MEANS TO REDUCE CONTAMINATION

[75] Inventors: Kaori Misawa; Hiroyasu Ishihara, both of Gifu-ken; Hideki Mizuhara, Bisai, all of Japan

[73] Assignee: Sanyo Electric Co., Ltd., Osaka, Japan

[21] Appl. No.: 09/030,560

[22] Filed: Feb. 25, 1998

[30] Foreign Application Priority Data

Feb. 27, 1997 [JP] Japan .................................. 9-044481

[51] Int. Cl.⁷ ........................... H01L 23/48; H01L 23/52; H01L 29/40
[52] U.S. Cl. ......................... 257/781; 257/780; 257/725; 257/773
[58] Field of Search .................................. 257/781, 780, 257/687, 690, 773, 725

[56] References Cited

FOREIGN PATENT DOCUMENTS 403019248  1/1991  Japan ........................................ 21/60

Primary Examiner—Tom Thomas
Assistant Examiner—Douglas W. Owens
Attorney, Agent, or Firm—Sheridan Ross P.C.

[57] ABSTRACT

An enclosure is formed on a substrate of a semiconductor device surrounding a bonding pad, such that a groove is formed between the enclosure and the bonding pad. An insulating film is formed over the substrate, including the enclosure and the groove. The groove and the film prevent moisture and contaminants from seeping into the semiconductor device.

5 Claims, 12 Drawing Sheets

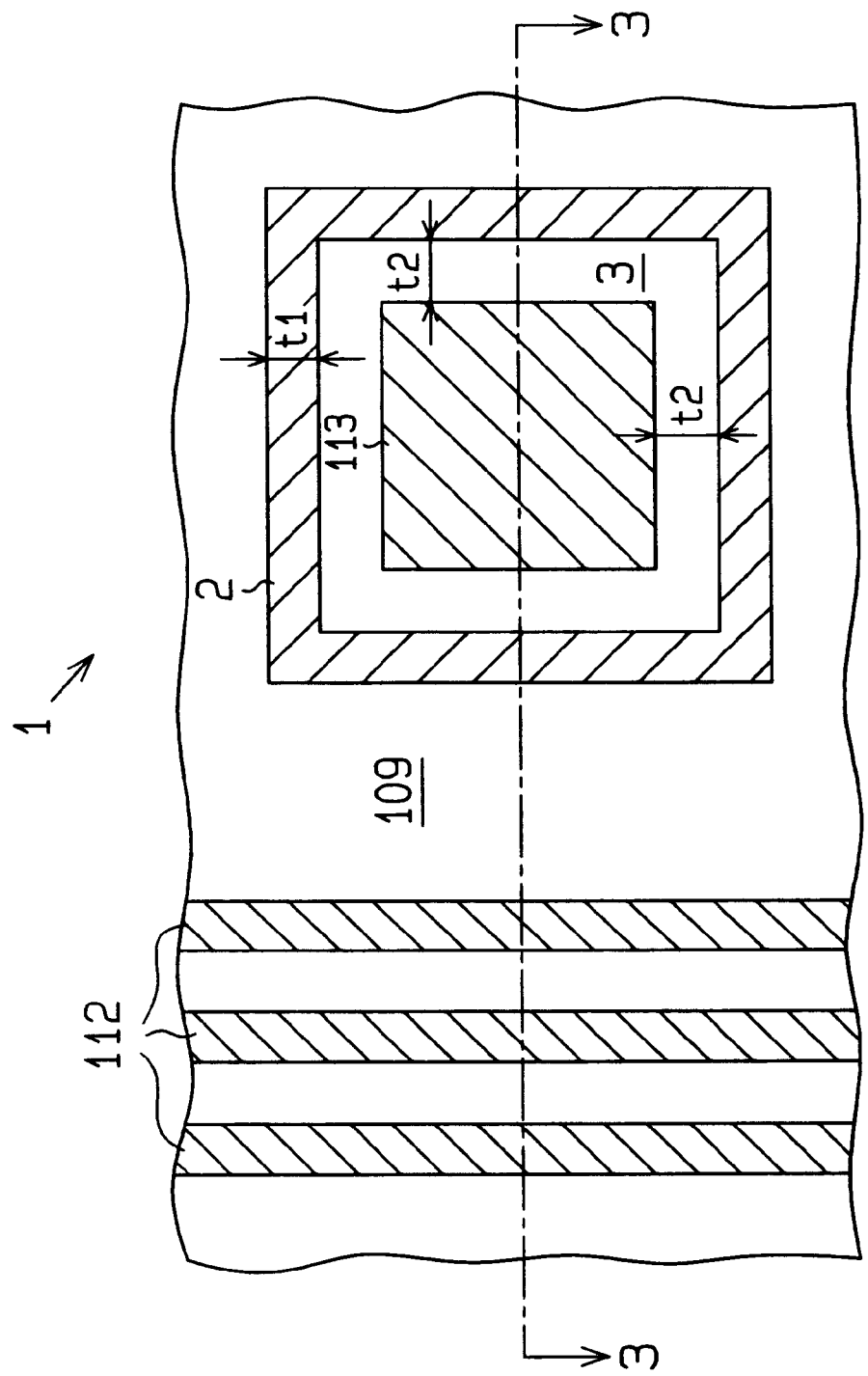

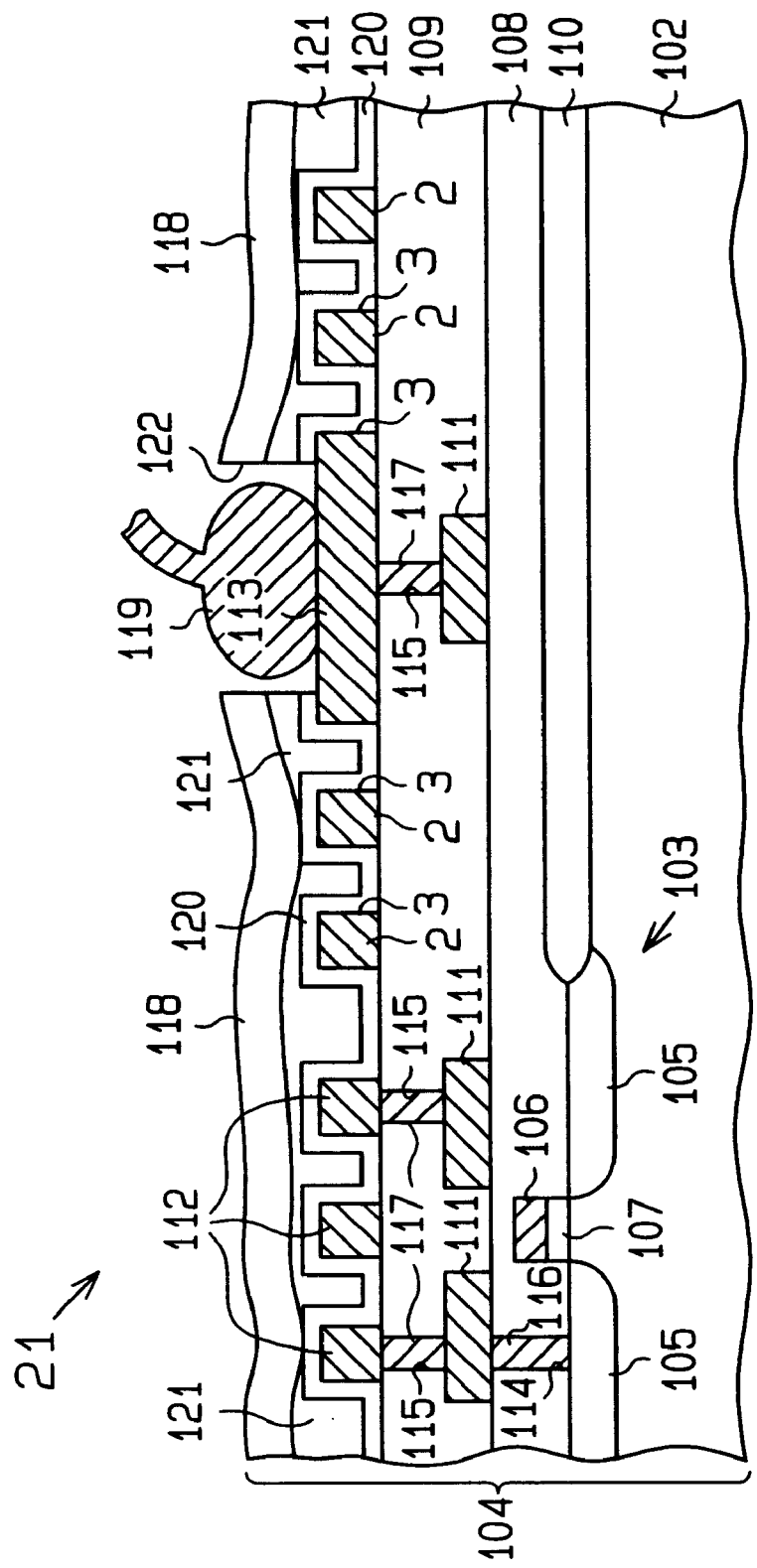

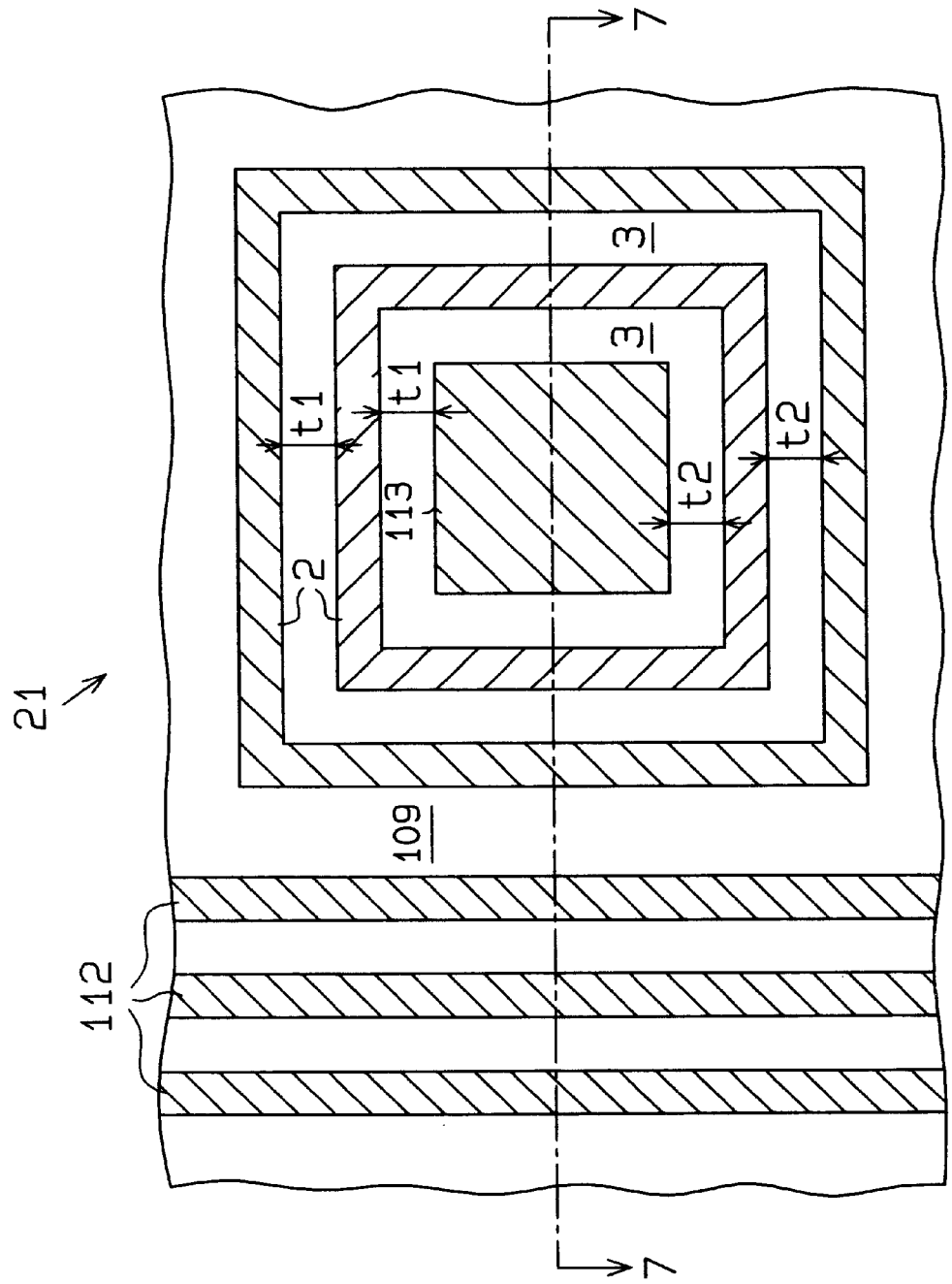

SEMICONDUCTOR DEVICES WITH MEANS TO REDUCE CONTAMINATION

BACKGROUND OF THE INVENTION

The present invention relates generally to a semiconductor device and a process for producing the same, and more particularly, to a semiconductor device having bonding pads and a process for producing the same.

When a semiconductor chip is mounted on a ceramic or resin package, the semiconductor chip is subjected to bonding treatment to electrically connect bonding pads on the chip to external lead terminals of the package. Such bonding methods include wire bonding for connecting bonding pads and lead terminals with thin metallic bonding wires and wireless bonding for connecting the bonding pads and the lead terminals without employing bonding wires.

FIG. 1 is a schematic cross-sectional view showing a prior art semiconductor chip 101. The semiconductor chip 101 comprises MOS transistors 103 formed on a semiconductor substrate 102 and a multilayer wiring 104 also formed on the semiconductor substrate 102.

The MOS transistors 103 each comprise source/drain regions 105 and a gate electrode 106. The source/drain regions 105 are formed on the semiconductor substrate 102. The gate electrode 106 is formed on the semiconductor substrate 102 between the source/drain regions 105 via a gate insulating film 107.

The multilayer wiring 104 comprises layer insulating films 108 and 109, a device-isolating insulating film 110, wirings 111 and 112, bonding pads 113, via holes 114 and 115, plugs 116 and 117 embedded in the via holes 114 and 115 respectively, and a passivation film 118.

The device-isolating insulating film 110 is formed on the semiconductor substrate 102 to isolate devices such as the MOS transistors 103 from one another. The layer insulating film 108 is formed on the semiconductor substrate 102 and on the device-isolating insulating film 110. The wirings 111 are formed on the layer insulating film 108. The wirings 112 are formed on the layer insulating film 109 which is the uppermost layer. Each bonding pad 113 is formed on the layer insulating film 109 using the same material and in the same step as the wirings 112.

The surfaces of the layer insulating films 108 and 109 are flattened by means of CMP (chemical Mechanical Polishing).

The layer insulating film 108 includes a plurality of via holes 114 extending perpendicular to the substrate 102. The plug 116 is embedded in each via hole 114 to connect electrically the source/drain region 105 and the wirings 111. The layer insulating film 109 includes a plurality of via holes 115 extending perpendicular to the substrate 102. The plugs 117 are embedded in the via holes 115 to secure electrical continuity between the wirings 111 and the wirings 112, and between the wirings 111 and the bonding pads 113.

The passivation film 118 is formed on the surface of the semiconductor chip 101 (on the wirings 112 and the layer insulating film 109) except for the central area of each bonding pad 113. The passivation film 118 protects the surface of the semiconductor chip 101 from being scratched or damaged. In other words, the passivation film 118 protects the chip 101. The passivation film 118 also prevents moisture and contaminants from intruding into the devices such as MOS transistors 103 and into the wirings 111 and 112 and plugs 116 and 117.

A bonding wire 119 is connected to the bonding pad 113 at an exposed central surface area (having no passivation film 118 formed thereon) by means of thermocompression bonding. The bonding wire 119 electrically connects the bonding pad 113 to a lead terminal (not shown) of the package.

With higher integration of semiconductor chips 101, wirings 112 are becoming finer to allow for higher wiring densities. The passivation film 118 is becoming thinner at steps in the wirings 112 (around the lower part 112a of each wiring 112) compared with other surface areas of the chip 101. This causes deterioration of the functions of the passivation film 118, disadvantageously. Further, the passivation film 118 can form voids 125, in gaps present between wirings 112. Moisture and contaminants, which affect the semiconductor chip 101, can be confined in the voids 125.

A second prior art semiconductor chip 201 is shown in FIG. 2. The chip 201 has an insulating film 120 formed on the wirings 112 and on the layer insulating film 109. A flattening insulating film 121, such as an SOG (Spin On Glass) film, is formed on the insulating film 120. A passivation film 118 is formed on the flattening insulating film 121. The surface of the passivation film 118 is flattened to have a uniform thickness.

It should be noted here that the central surface area of the bonding pad 113 is exposed through an opening 122 formed through the films 118, 121 and 120. A bonding wire 119 is connected to the central surface area by means of thermocompression bonding.

However, the flattening insulating film 121 exposes itself at the wall of the opening 122. It is known that SOG films have low barrier properties against moisture and contaminants. Accordingly, as arrows "A" indicate in FIG. 2, moisture and contaminants may creep along the wall of the opening 122 and penetrate the flattening insulating film 121, thereby contaminating the semiconductor chip 201. The moisture and contaminants which intrude into the chip 201 causes deterioration of the properties of devices, such as MOS transistors 103 and continuity failure due to corrosion in the wirings 111 and 112 and plugs 116 and 117, thereby lowering wiring reliability.

It is an objective of the present invention to provide a semiconductor device having bonding pads which prevent deterioration of device performance and wiring reliability, as well as, a process for producing the same.

SUMMARY OF THE INVENTION

To achieve the above objective, the present invention provides a semiconductor device, comprising: a substrate; a bonding pad provided over the substrate; and an enclosure provided over the substrate and surrounding the bonding pad; wherein a groove having a predetermined width and a predetermined depth is formed between the bonding pad and the enclosure.

The present invention further provides a semiconductor device, comprising: a substrate; and a bonding pad provided over the substrate; wherein the substrate has a groove formed to surround a peripheral portion of the bonding pad, and wherein the groove has a predetermined width and a predetermined depth.

The present invention provides a process for producing a semiconductor device, comprising the steps of: forming an insulating film on a substrate; forming a bonding pad on the insulating film; forming an enclosure surrounding the bonding pad on the insulating film; forming a liquid film over the insulating film the bonding pad and the enclosure, wherein the liquid film discontinued on and along the enclosure; and heat treating the liquid film to form a flattening insulating film.

The present invention further provides a process for producing a semiconductor device, comprising the steps of: forming an insulating film on a substrate; forming a groove in the substrate to surround a predetermined portion thereof; forming a via hole in the insulating film; and forming a bonding pad over the predetermined portion of the substrate such that the bonding pad is surrounded by the groove.

The present invention provides a process for producing a semiconductor device, comprising the steps of: forming an insulating film on a substrate; forming a groove over the substrate to surround a predetermined portion thereof; forming a via hole in the insulating film; forming a conductive film in the via hole and the groove; removing partly the conductive film in the groove; forming a wiring and a bonding pad on the insulating film; forming a liquid film on a surface of the substrate including the bonding pad and the groove, wherein the liquid film is interrupted by a peripheral edge of the bonding pad; and heat treatment the liquid film to form a flattening insulating film.

The present invention provides a improved semiconductor device comprising: a substrate; a plurality of MOS devices defined on the substrate; a device isolation insulating film formed on the substrate over the MOS devices; a first insulating layer formed on the device isolation film; at least one metal layer formed on the first insulating layer; a second insulating layer formed on the at least one metal layer; a plurality of vias extending between the at least one metal layer and the MOS devices for interconnecting the MOS devices; at least one bonding pad formed on a surface of the second insulation layer and electrically connected to the at least one metal layer; an insulation film formed over the second insulating layer, the insulation film also covering a peripheral edge of the bonding pad; and means surrounding the at least one bonding pad for preventing moisture and contaminants from seeping into and damaging the semiconductor device.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with the objects and advantages thereof, may best be understood by reference to the following description of the presently preferred embodiments together with the accompanying drawings in which:

FIG. 4 is a plan view showing the semiconductor chip shown in FIG. 3(a):

FIG. 7 is a schematic cross-sectional view showing a semiconductor chip according to a third embodiment of the present invention;

FIG. 8 is a plan view of the semiconductor chip of FIG. 7;

DETAILED DESCRIPTION OF THE PREFERRED EMBODIMENTS

Figure 1:
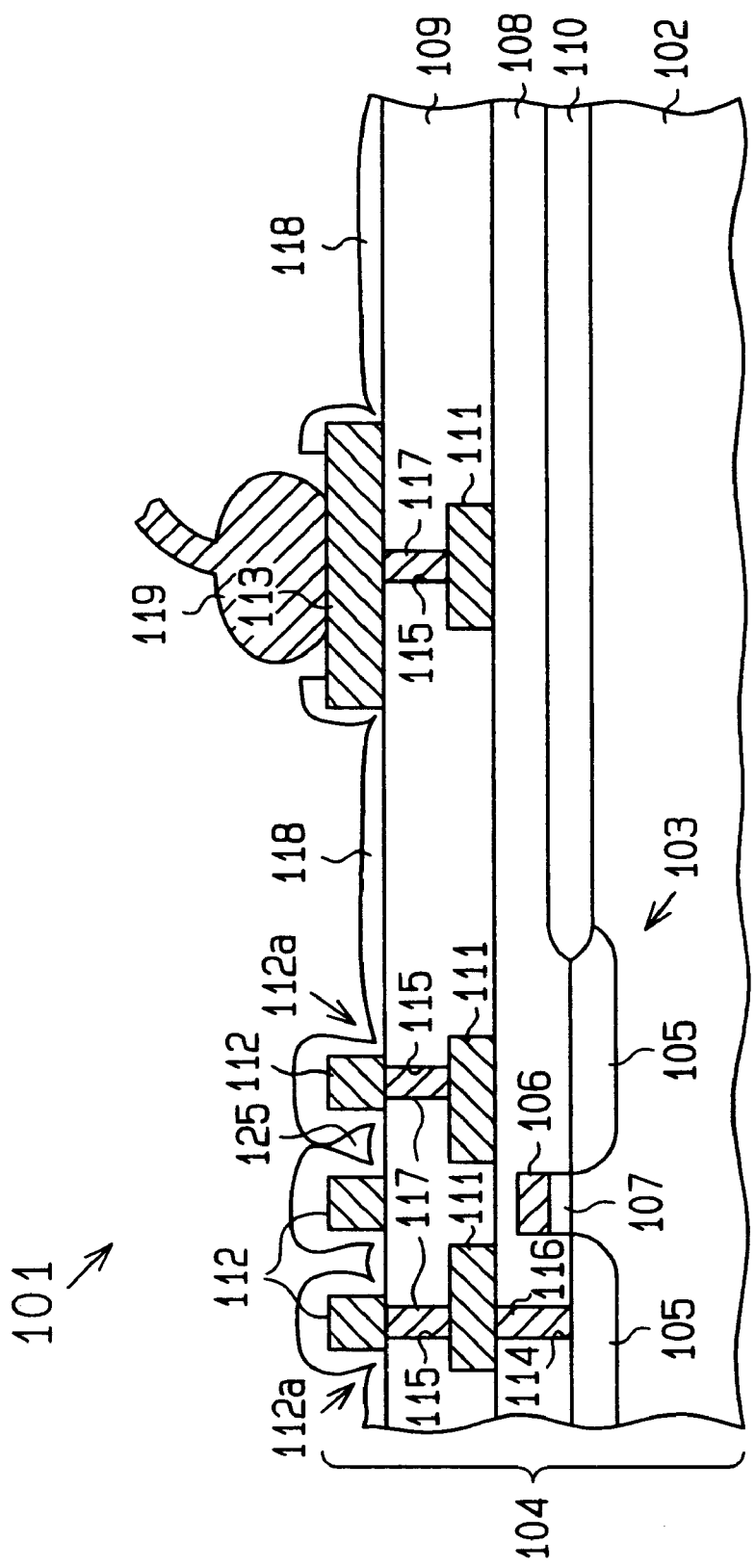
FIG. 1 is a schematic cross-sectional view of a prior art semiconductor chip.
Figure 2:
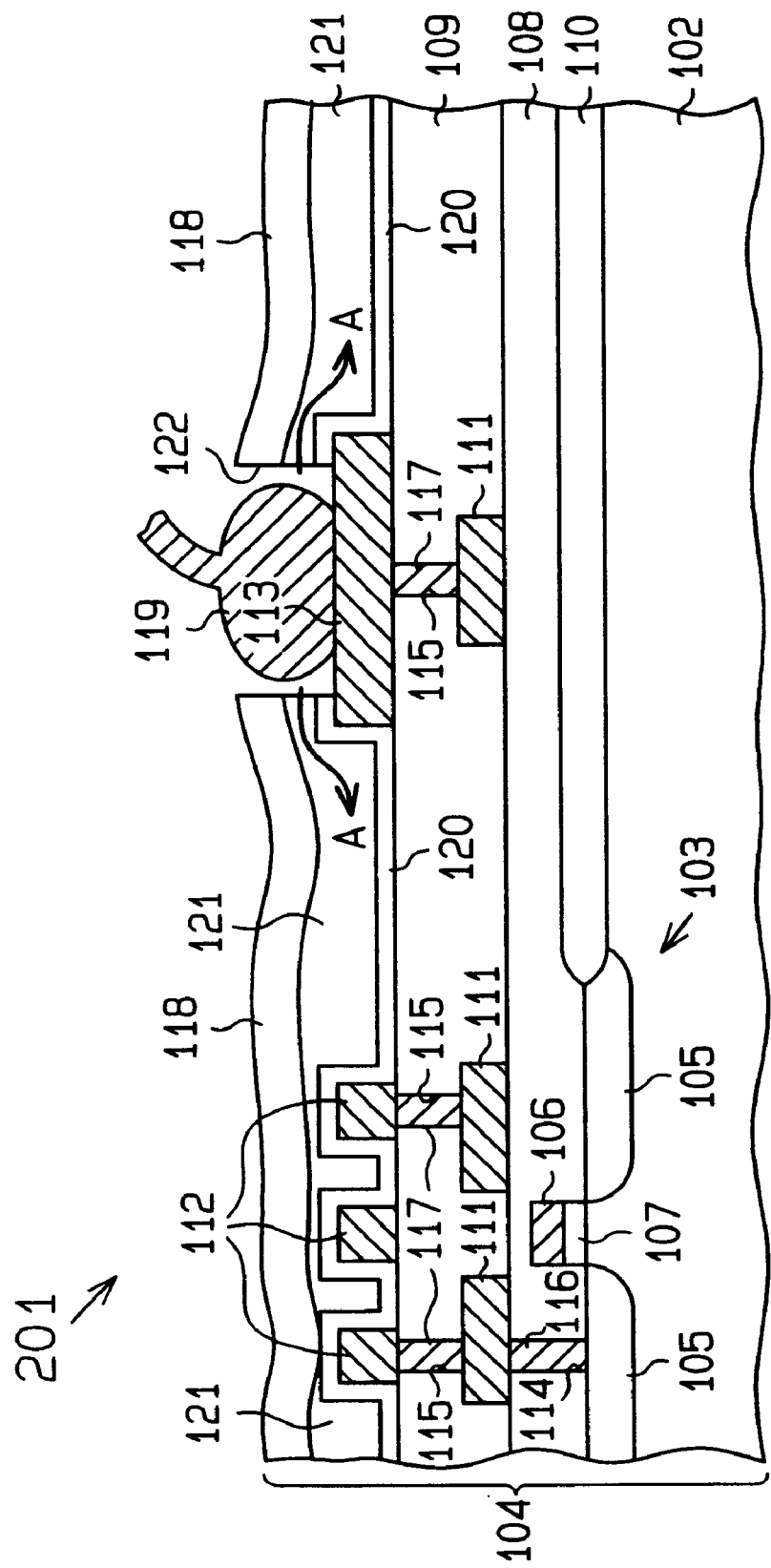
FIG. 2 is a schematic cross-sectional view of another prior art semiconductor chip.

In the drawings, like numerals are used to designate like elements throughout.

First Embodiment

A semiconductor chip 1 according to a first embodiment of the present invention and a process for producing the chip 1 will now be described below referring to the attached drawings. First, the process for producing the semiconductor chip 1 will be described step by step referring to FIGS. 3(a) to 5(b).

Step 1

Figure 3A:
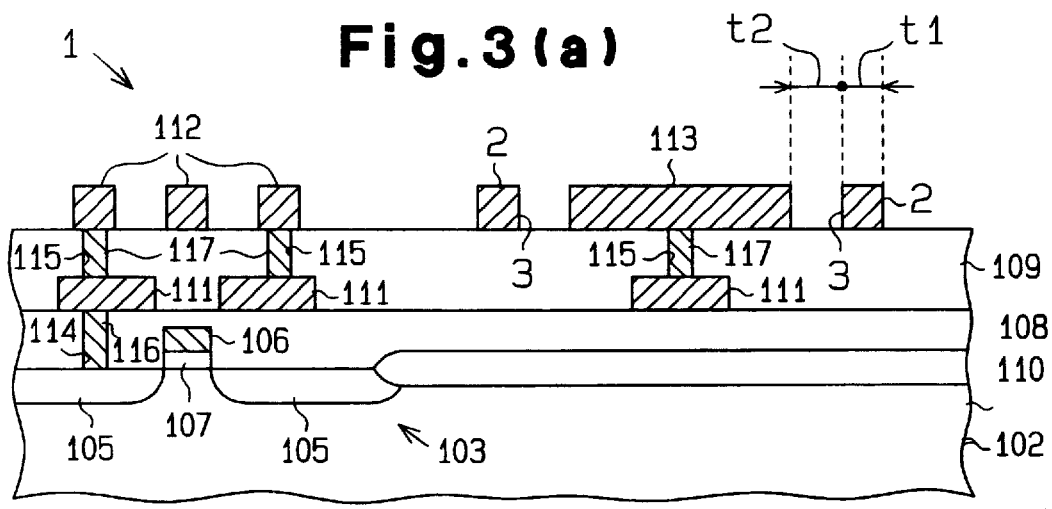
FIGS. 3(a)–3(c) are a schematic cross-sectional views showing first through third steps in a process for producing a semiconductor chip according to a first embodiment of the present invention.

Referring to FIG. 3(a), a device-isolating insulating film 110 is formed on a semiconductor substrate 102 by means of LOCOS (Local Oxidation of Silicon). A gate electrode 106 is formed via a gate insulating film 107 at each exposed area (where the insulating film 110 is not formed) of the semiconductor substrate 102. An impurity ion is implanted in the semiconductor substrate 102 using the gate electrode 106 as an ion implantation mask to form source/drain regions 105 on the substrate 102. Thus, MOS transistors 103 are formed on the semiconductor substrate 102. The semiconductor substrate 102 may be provided with various kinds of electronic devices (not shown) such as bipolar transistors, resistors and capacitors, in addition to the MOS transistors 103.

Next, a layer insulating film 108 is formed on the semiconductor substrate 102 and the device-isolating insulating film 110. The surface of the layer insulating film 108 is flattened preferably by means of CMP or other known methods.

Subsequently, via holes 114 are formed in the layer insulating film 108 by means of photolithography and anisotropic etching. Plugs 116 preferably containing tungsten. are formed in the via holes 114 by means of MOCVD or other known means. The portions of the plugs 116 protruding out of the via holes 114 are etched back.

Wirings 111 are then formed on the layer insulating film 108, and a layer insulating film 109 is formed on the wirings 111. The surface of the layer insulating film 109 is flattened preferably by means of CMP or other known methods.

Subsequently, via holes 115 are formed in the layer insulating film 109 by means of photolithography and anisotropic etching. Plugs 117 preferably containing tungsten. are formed in the via holes 115 by means of MOCVD or other known methods. The portions of the plugs 117 protruding out of the via holes 115 are etched back.

Next, wirings 112, bonding pads 113 and enclosures 2 are formed substantially simultaneously on the layer insulating film 109. Preferably the wirings 112, the bonding pads 113 and the enclosures 2 have the same film thickness, and are formed from the same conductive film material.

The layer insulating films 108 and 109, preferably comprise silicon oxide, silicon nitride, silicon oxynitride, silicate glass (e.g., PSG, BSG and BPSG), etc. The layer insulating films 108 and 109 are preferably formed by means of CVD or PVD. The wirings 111 and 112, bonding pads 113 and enclosures 2, comprise conductive materials, such as aluminum alloys, various kinds of high-melting metals (e.g., titanium, tungsten and molybdenum) as simple substances or alloys thereof, and polysilicon. The wirings 111 and 112, bonding pads 113 and enclosures 2 are preferably formed by means of CVD or PVD is employed.

FIG. 4 is a plan view showing the semiconductor chip 1 when Step 1 is completed, and FIG. 3(a) is a cross-section taken along the line 3—3 in FIG. 4. As shown in FIG. 4, each bonding pad 113, which preferably has a rectangular shape, is surrounded by the enclosure 2. The enclosure 2 has a predetermined wall thickness t1. A predetermined clearance t2 is located between the bonding pad 113 and the enclosure 2. The bonding pad 113 and the enclosure 2 define a groove 3 between therebetween.

Step 2

Figure 3B:
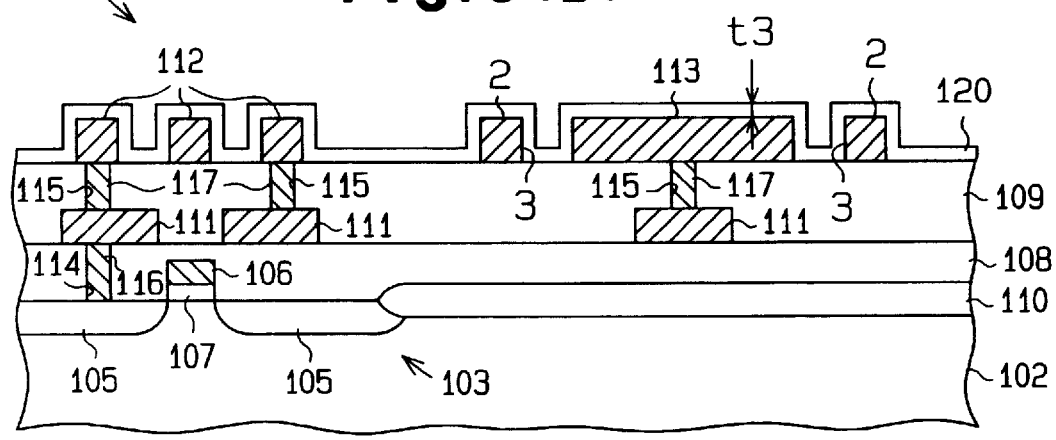

Referring now to FIG. 3(b), an insulating film 120 having a predetermined film thickness t3 is formed on the wirings 112, bonding pads 113, enclosures 2 and layer insulating film 109. The insulating film 120 preferably comprises silicon oxide, silicon nitride or silicon oxynitride. The film 120 is preferably formed by means of CVD or PVD. Since the insulating film 120 is formed on the wall surfaces of each groove 3, the width (t2) of the groove 3 is narrowed by the film 120 thickness t3. The insulating film 120 preferably has high insulating properties and high mechanical strength and contains neither moisture nor hydroxyl groups such that it exhibits high barrier properties against moisture, hydroxyl groups and contaminants. Insulating films having such properties include TEOS (Tetra Ethoxy Silage) films formed by means of plasma CVD and silicon oxide films formed by means of plasma CVD or ECR plasma CVD. However, other films which have such properties may also be used.

Step 3

Figure 3C:
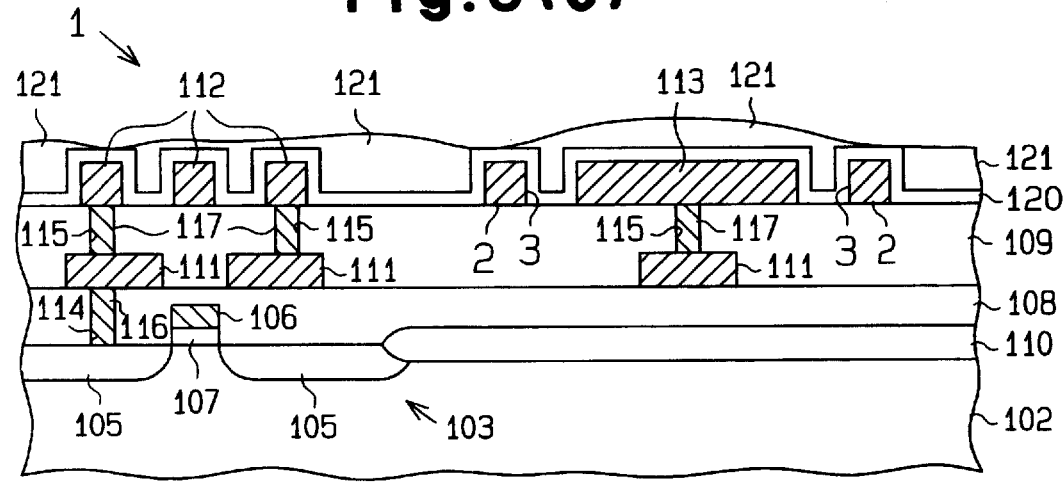

Referring to FIG. 3(c), a flattening insulating film 121, such as an SOG film, is formed on the insulating film 120. The SOG film may comprise either an inorganic SOG film or an organic SOG film and may be formed by means of spin coating.

According to the spin coating method, a solution of a silicon compound in ethanol having the formula (1) or (2), described below (hereinafter referred to as SOG solution) is disposed on the insulating film 120, and the semiconductor chip 1 is then spun to form the 121.

The film 121 is formed so that it is thick at recesses (gaps in and between the wirings 112, bonding pads 113 and enclosures 2 on the insulating film 120) and thin on protrusions (the wirings 112, and enclosures 2) to reduce steps on the semiconductor chip 1. Further, the film 121 is formed so that it is thick on patterns having large surface areas (bonding pads 113) and thin on patterns having small surface areas (wirings 112 and enclosures 2).

The SOG solution flows into each groove 3. That is, the SOG solution collecting along the peripheral portion of each bonding pad 113 flows into the groove 3, and the film 121 becomes thin along the peripheral portion. It should be noted here that the clearance t2 and the film thickness t3 are set so that the groove 3 has a width (t2−2×t3) which allows intrusion of the SOG solution.

As described above, since the thickness of the film 121 is small on the protrusions, and if the SOG solution collecting in a very small amount on the enclosure 2 flows into the groove 3, the film 121 is discontinued on and along the enclosure 2. It should be noted here that the enclosure 2 is designed to have a wall thickness t1 such that the film 121 does not remain on the enclosure 2.

Next, the film 121 is subjected to heat treatment under atmospheric conditions. The heat treatment effects evaporation of the ethanol contained in the SOG solution and polymerization of the silicon compound. The heat treatment may comprise baking, which flattens the insulating film 121, such that the film 121 is discontinued on and along the enclosure 2.

SOG films include inorganic SOG films in which the silicon compounds contain no organic components as represented by the general formula (1):

$$[SiO_2]_n \qquad (1)$$

(wherein n is an integer),
and organic SOG films in which the silicon compounds contain organic components as represented by the general formula (2):

$$[R_xSiO_y]_n \qquad (2)$$

(wherein n, x and y are integers; and R represents an alkyl group or an aryl group).

Inorganic SOG films contain large amounts of moisture and hydroxyl groups and have high hygroscopicity, and are relatively brittle compared with silicon oxide films formed by means of CVD. Further, inorganic SOG films involve a problem in that the SOG films readily undergo cracking during heat treatment, if thick films are formed.

Meanwhile, organic SOG films do not undergo cracking during heat treatment, so that thick films may be formed. Accordingly, if an organic SOG film is employed as the flattening insulating film 121, the surface of the semiconductor chip 1 may be flattened fully even if it has large steps thereon. However, organic SOG films contain moisture and hydroxyl groups and have high hygroscopicity, though not conspicuous compared with inorganic SOG films.

Further, both organic SOG films and inorganic SOG films have low insulating properties, low mechanical strength and low barrier properties against moisture and hydroxyl groups compared with silicon oxide films formed by means of CVD.

Step 4

Figure 5A:
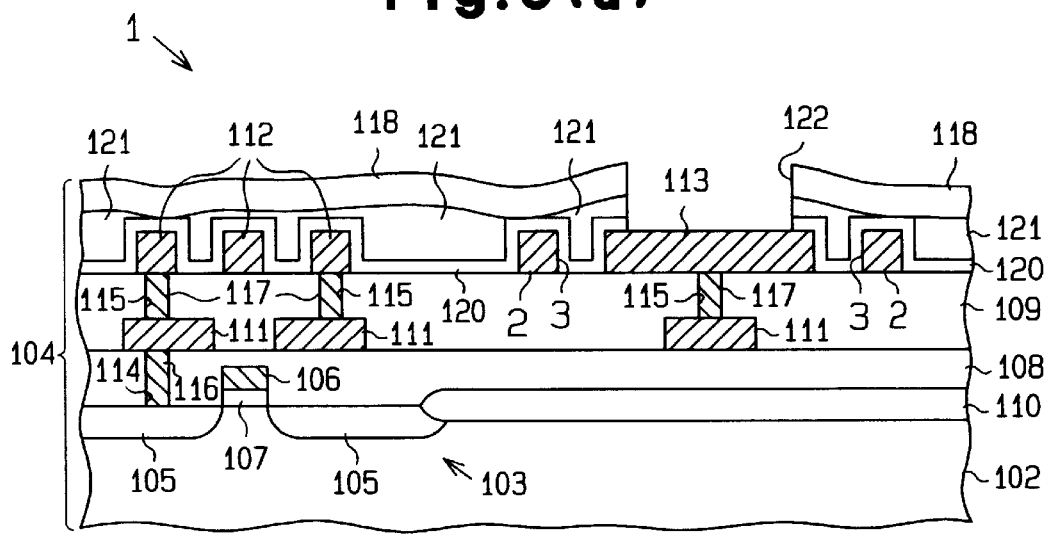
FIG. 5(a) is a schematic cross-sectional view showing a step subsequent to the step shown in FIG. 3(c)

Referring to FIG. 5(a), a passivation film 118 is formed on the flattening insulating film 121. The passivation film 118 preferably comprises silicon oxide, silicon nitride or silicon oxynitride and is formed by means of CVD or PVD.

Thus, a multilayer wiring 104 comprising the layer insulating films 108 and 109, device-isolating insulating film 110, wirings 111 and 112, bonding pads 113, via holes 114 and 115, plugs 116 and 117, passivation film 118, insulating film 120, flattening insulating film 121 and enclosures 2 is fabricated. Then, openings 122 are formed through the films 118, 121 and 120 by means of photolithography and anisotropic etching.

Step 5

Figure 5B:
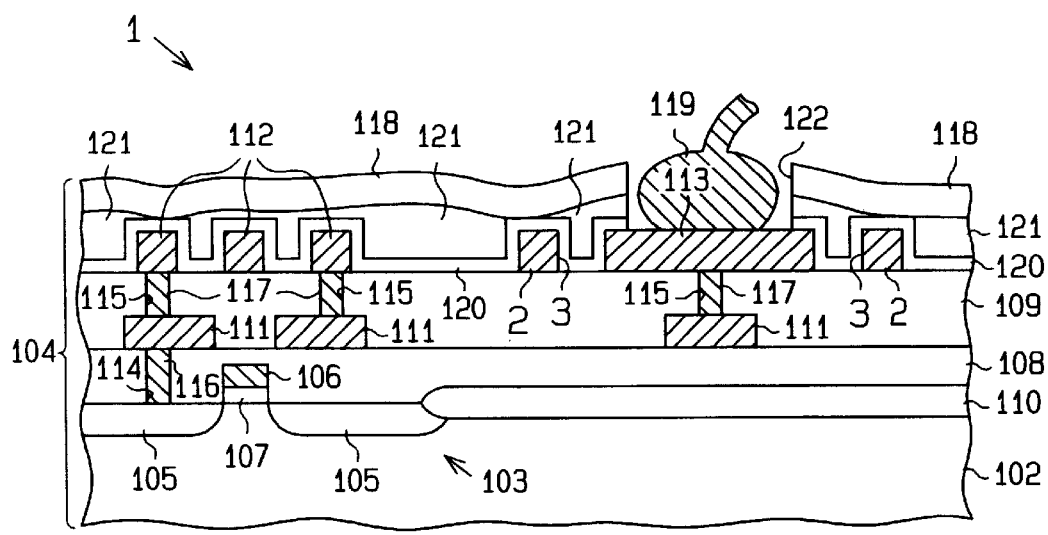
FIG. 5(b) is a schematic cross-sectional view showing a step subsequent to the step shown in FIG. 5(a)

Referring to FIG. 5(b), a bonding wire 119 is connected to the central area of each bonding pad 113 bonding.

As described above, according to the first embodiment, although the flattening insulating film 121 is exposed at the wall of each opening 122, it is discontinued on and along the enclosure 2. Accordingly, external moisture and contaminants are prevented from intruding into the semiconductor chip 1. That is, external moisture and contaminants may penetrate the flattening insulating film 121 exposed at the wall of the opening 122 to the portion present in and above the groove 3, but moisture and contaminants do not intrude any further into the semiconductor chip 1.

Consequently, various discrepancies attributed to moisture and contaminants, for example, deterioration of the properties of devices such as MOS transistors 103, continuity failure caused by corrosion of the wirings 111 and 112 and the plugs 116 and 117 are prevented. Thus, wiring reliability of the semiconductor chip 1 is improved.

Further, according to the first embodiment, since the enclosures 2 are formed at the same time as the wirings 112 and the bonding pads 113 using the same material, formation of the enclosures 2 does not increase the number of steps in the production process.

In addition, since the first embodiment employs a sandwich structure in which the flattening insulating film 121 is sandwiched between the insulating film 120 and the passivation film 118, insulating properties and mechanical strength of the films 120, 121 and 118 as a whole are improved. Since the insulating film 120 is formed under the flattening insulating film 121, the moisture and hydroxyl groups contained in the film 121 are prevented from intruding into the lower layers by the insulating film 120. Accordingly, detrimental influence of moisture and hydroxyl groups on the semiconductor chip 1 (devices such as MOS transistors, wirings 111 and 112 and plugs 116 and 117) are eliminated.

Second Embodiment

A process for producing a semiconductor chip 11 according to a second embodiment of the present invention will now be described below.

Steps 1 to 3 are the same as those in the first embodiment (see FIGS. 3(a)–3(c).

Step 6

Referring to FIG. 4(a), the flattening insulating film 121 is flattened by means of overall etchback to remove the flattening insulating film 121 present on each enclosure 2 completely. Thus, the flattening insulating film 121 is prevented from being exposed at the wall of each opening 122. In addition, the flattening insulating film 121 is securely interrupted by the enclosures 2.

If a silicon oxide film is employed as the insulating film 120, the overall etchback is carried out under conditions such that the etching rate of the SOG film may be higher than that of the silicon oxide film, thus minimizing removal of the insulating film 120 and ensuring flattening of the surface of the SOG film. For example, when an organic SOG film which is most preferred as the insulating film 120 is employed, the etching rate of the organic SOG film may be higher than that of the silicon oxide film by adding oxygen to a fluorocarbon etching gas (e.g., $CF_4$, $C_2F_6$ and $NF_3$).

Next, a passivation film 118 is formed on the flattening insulating film 121, and then openings 122 are formed through the laminated films 118 and 120 by means of photolithography and anisotropic etching.

Figure 6A:
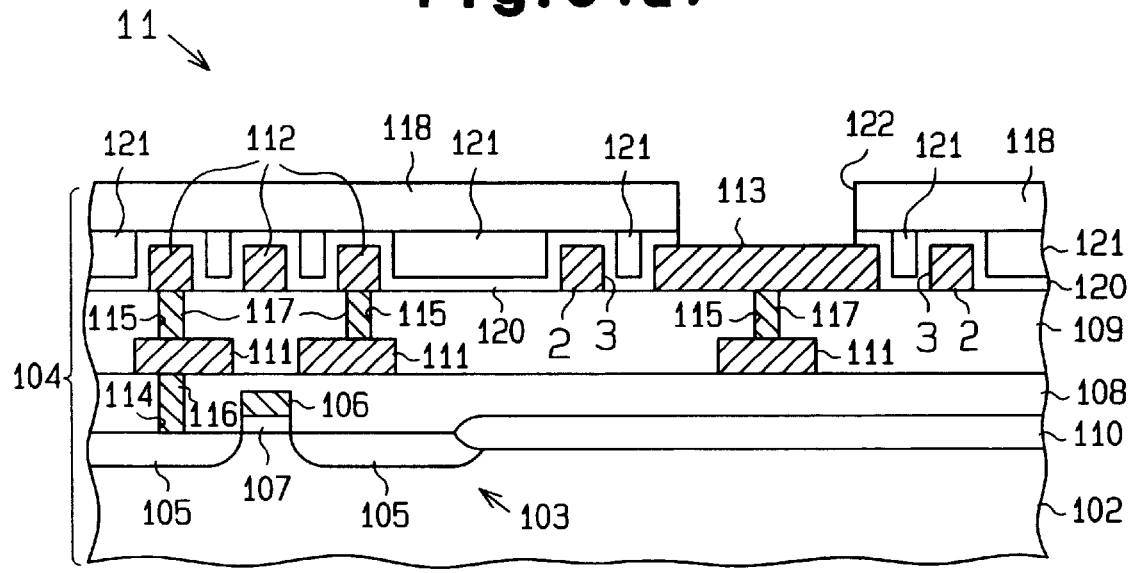
FIGS. 6(a)–6(b) are schematic cross-sectional views showing two steps in a process for producing a semiconductor chip according to a second embodiment of the present invention.
Figure 6B:
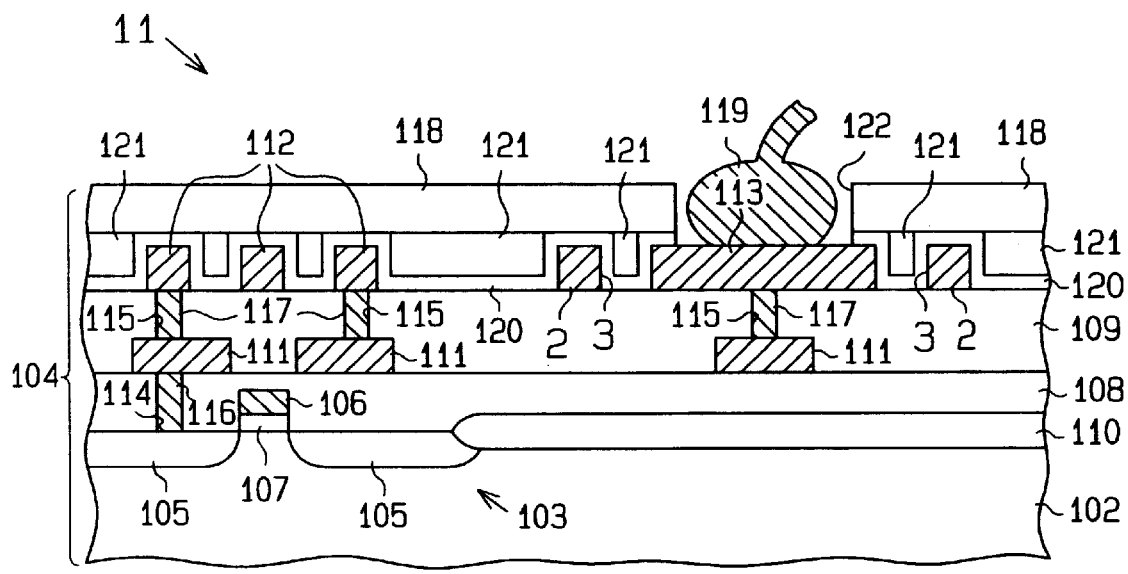

Step 5 (see FIG. 6(b) is the same as step 5 of the first embodiment.

In the second embodiment, the flattening insulating film 121 is not exposed at the wall of each opening 122. In addition, the flattening insulating film 121 is securely interrupted by each enclosure 2. Accordingly, various discrepancies attributed to moisture and contaminants are eliminated, and thus wiring reliability is improved.

Third Embodiment

In a semiconductor chip 21 according to a third embodiment of the invention shown in FIGS. 7 and 8, what is different from the semiconductor chip 1 of the first embodiment is that each bonding pad 113 is surrounded by two enclosures 2. The two enclosures 2 ensure interruption of the flattening insulating film 121. Accordingly, the same effects as in the first embodiment more certain to be exhibited.

Alternatively, each pad 113 may be surrounded by concentric three or more enclosures 2.

Fourth Embodiment

A process for producing a semiconductor chip 31 according to a fourth embodiment of the present invention will now be described below referring to the drawings.

Step 1 (FIG. 9(a)) is different from Step 1 of the first embodiment as follows:

(1) A groove 32 having a predetermined width t4 and a predetermined depth d4 is formed, in place of the enclosure 2, on the surface of the semiconductor substrate 102 immediately below the periphery of each bonding pad 113; and (2) The surfaces of the layer insulating films 108 and 109 are not flattened.

Figure 9A:
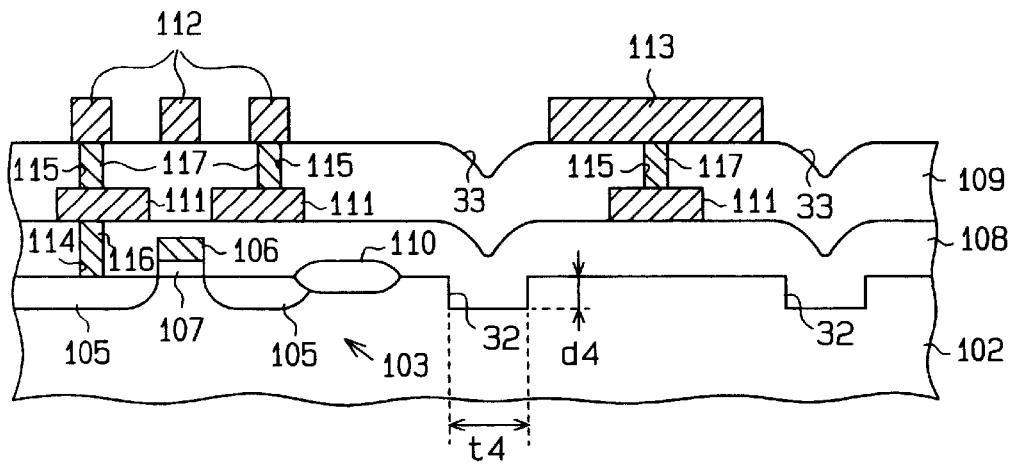
FIG. 9(a) is a schematic cross-sectional view showing a step in a process for producing a semiconductor chip according to a fourth embodiment of the present invention.
Figure 9B:
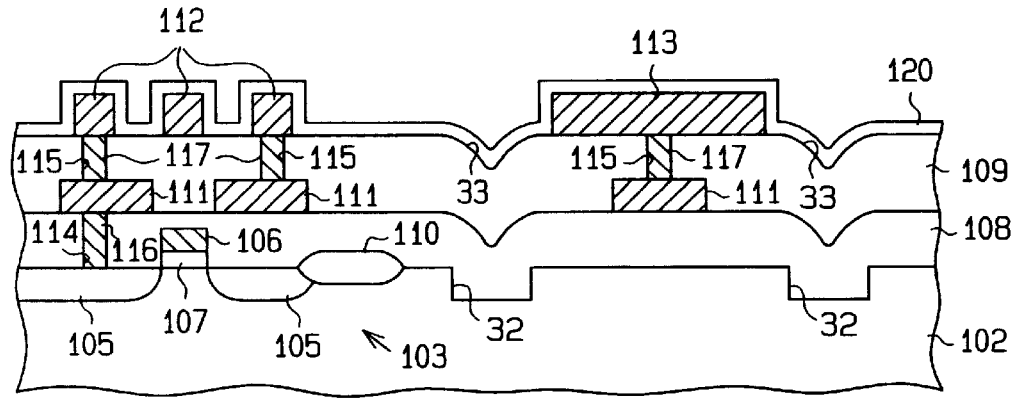
FIG. 9(b) is a schematic cross-sectional view showing a step subsequent to the step shown in FIG. 9(a)

In Step 1 (FIG. 9(a)), a groove 33, corresponding to the groove 32 on the semiconductor substrate 102, is formed on in the layer insulating film 109 around each bonding pad 113.

Steps 2 to 5 (see FIG. 9(b) to 10(b)):

Steps 2 to 5 are the same as steps 2 to 5 of the first embodiment.

Figure 9C:
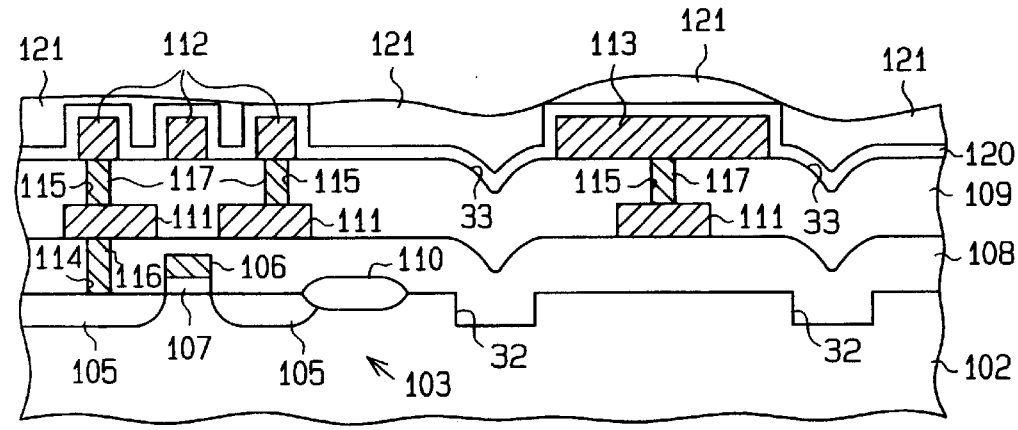
FIG. 9(c) is a schematic cross-sectional view showing a step subsequent to the step shown in FIG. 9(b)
Figure 10A:
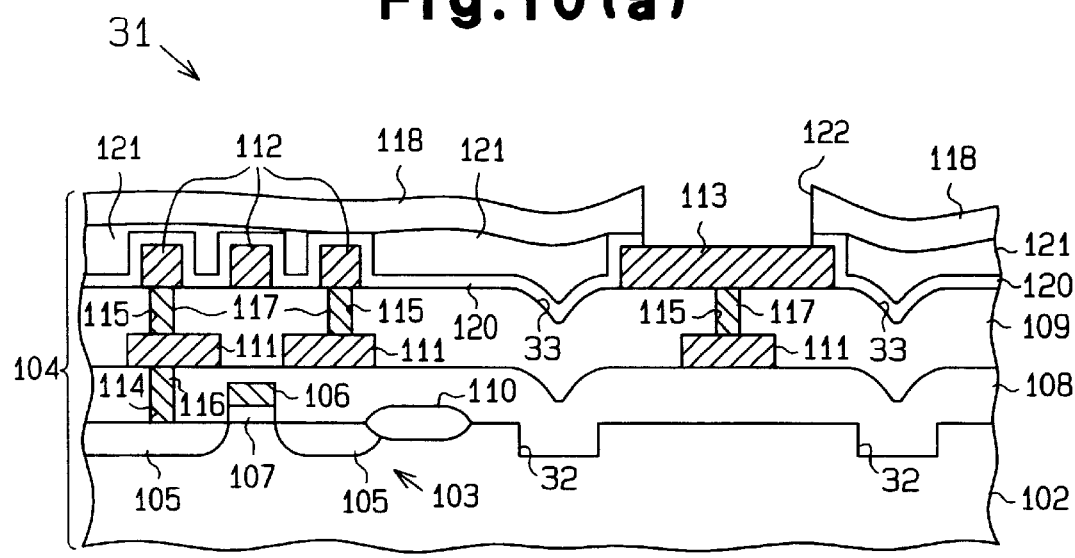
FIG. 10(a) is a schematic cross-sectional view showing a step subsequent to the step shown in FIG. 9(c)
Figure 10B:
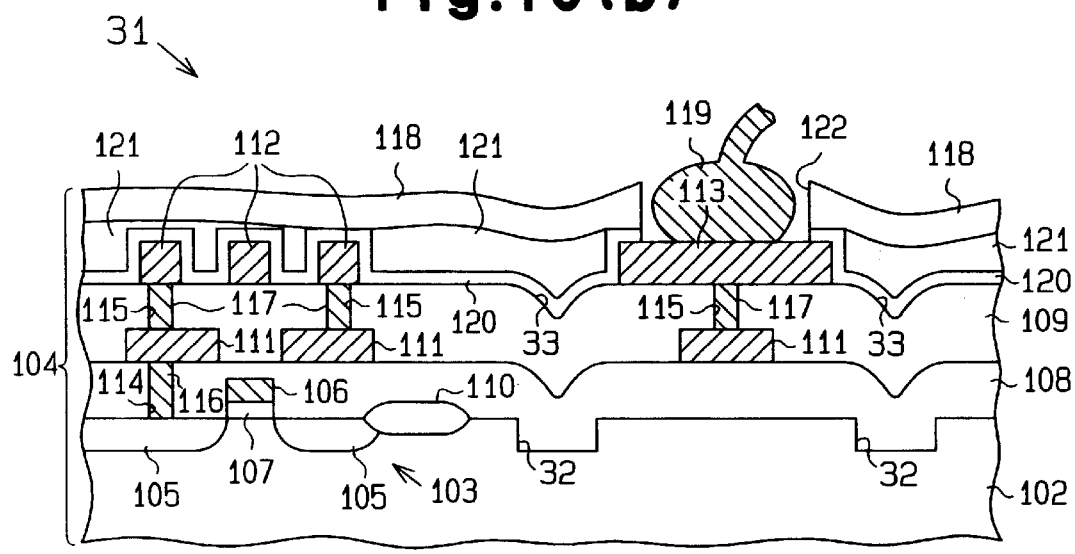
FIG. 10(b) is a schematic cross-sectional view showing a step subsequent to the step shown in FIG. 10(a)
Figure 11:
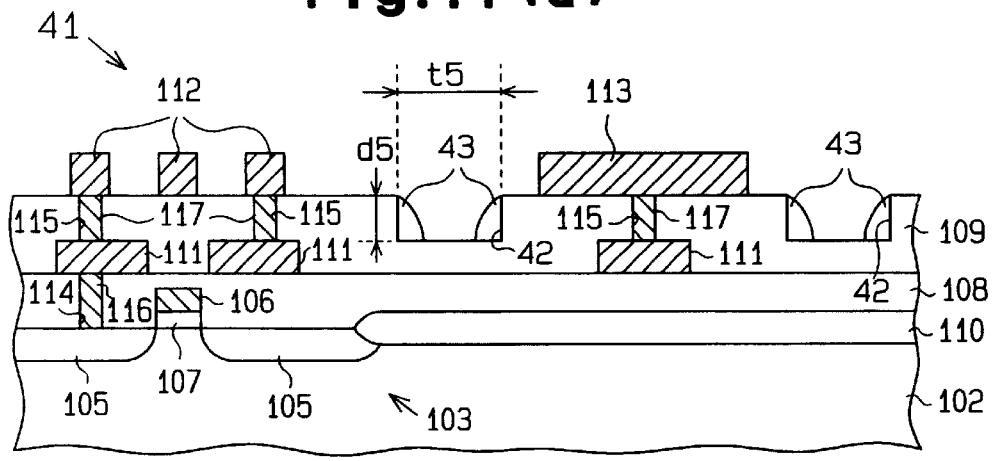
FIG. 11(a) is a schematic cross-sectional view showing a step in a process for producing a semiconductor chip according to a fifth embodiment of the present invention.
FIG. 11(b) is a schematic cross-sectional view showing a step subsequent to the step shown in FIG. 11(a)
FIG. 11(c) is a schematic cross-sectional view showing a step subsequent to the step shown in FIG. 11(b)
Figure 11:
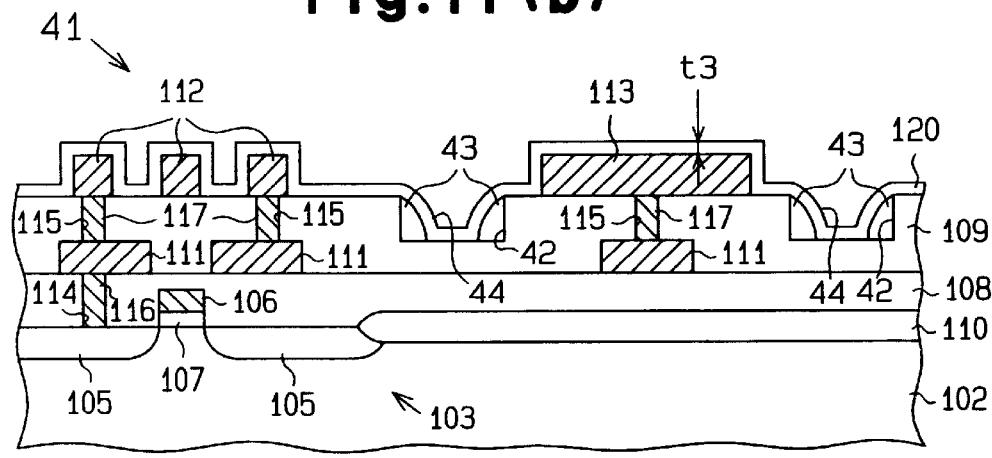
Figure 11:
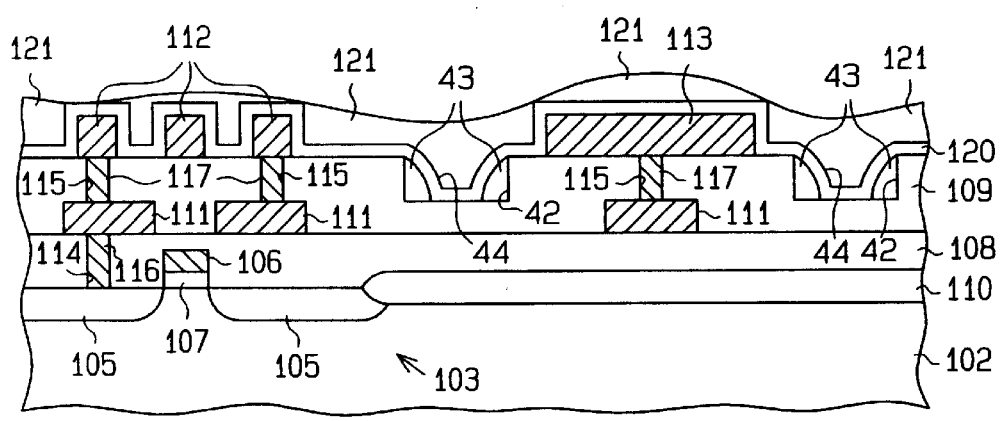
Figure 12A:
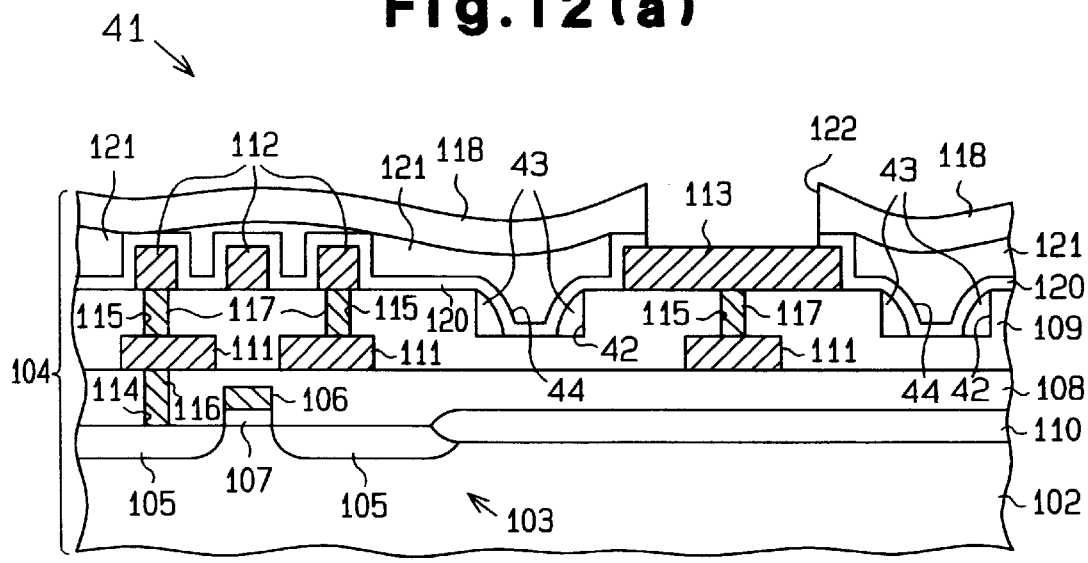
FIG. 12(a) is a schematic cross-sectional view showing a step subsequent to the step shown in FIG. 11(c)
Figure 12B:
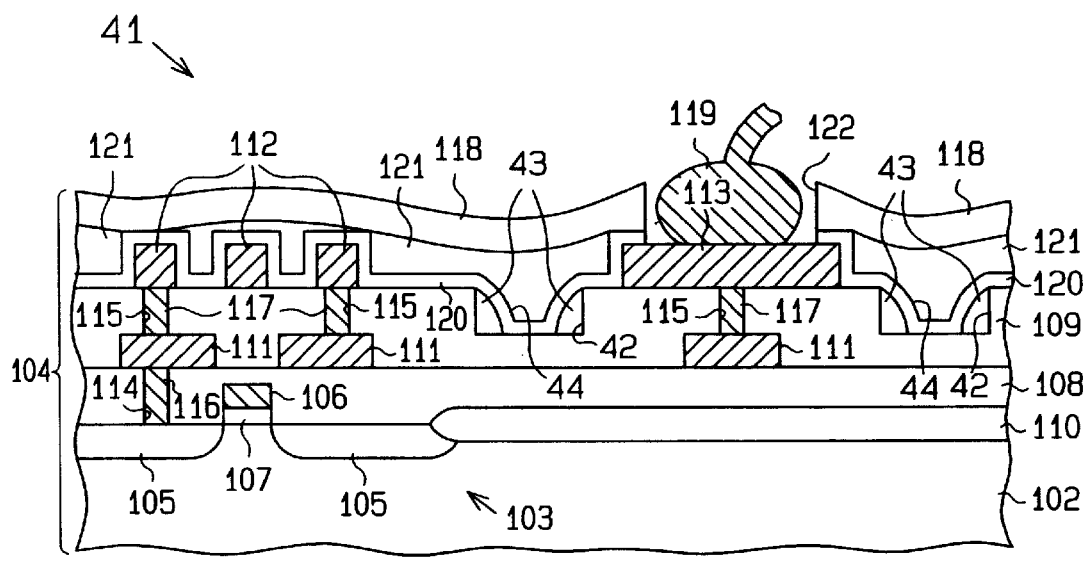
FIG. 12(b) is a schematic cross-sectional view showing a step subsequent to the step shown in FIG. 12(a).

In Step 3 (FIG. 9(c)), the SOG solution also flows into the grooves 33. Thus, the SOG solution collecting on the peripheral portion of each bonding pad 113 flows into the groove 33, such that no film of SOG solution remains on the peripheral portion of the pad 113. That is, the film of SOG solution formed on the semiconductor chip 31 is interrupted by the upper peripheral edge of the bonding pad 113. In other words, the groove 33 is sized such that the film of SOG solution does not remain on the peripheral portion of the bonding pad 113. Accordingly, the SOG film serving as the flattening insulating film 121 formed by baking the SOG solution is also interrupted by the upper peripheral edge of the bonding pad 113. The interruption of the flattening insulating film 121 prevents moisture and contaminants from intruding into the semiconductor chip 31.

Although the fourth embodiment requires an additional step of forming the grooves 32 on the semiconductor substrate 102, it requires no steps of flattening the insulating films 108 and 109, so that it does not lead to increase in the overall production cost.

Alternatively, two or more concentric grooves 32 may be formed around and below each bonding pad 113.

Fifth Embodiment

A process for producing a semiconductor chip 41 according to a fifth embodiment of the present invention will now be described below referring to FIGS. 11(a) to 12(b).

Step 1 (FIG. 11(a)) is different from that of the first embodiment in the following points:

(1) A groove 42 having a predetermined width t5 and a predetermined depth d5 is formed, in place of the enclosure 2, on the surface of the layer insulating film 109 around each bonding pad 113. The groove 42 is formed at the same time as the holes 115 are formed; and (2) When the plugs 117 are formed in the via holes 115, a film (not shown) of the same material as the plugs 117 having a predetermined film thickness t6 is formed in each groove 42. The film formed in each groove 42 is etched back when the plugs 117 are etched back. Thus, the film formed in each groove 42 forms side wall spacers 43 on the walls of the groove 42.

Step 2 (see FIG. 11(b)):

An insulating film 120 having a predetermined thickness t3 is formed on the semiconductor chip 41 (on the wirings 112, bonding pads 113 and layer insulating film 109). Since the layer insulating film 109 contains the grooves 42 and side wall spacers 43, grooves 44 are formed on the surface of the insulating film 120 around the bonding pads 113.

Steps 3 to 5 (see FIGS. 11(c) to 12(b)):

Steps 3 to 5 are the same as steps 3–5 of the first embodiment.

The grooves 44 in the fifth embodiment function the same as the grooves 32 in the fourth embodiment. In Step 3 (FIG. 11(c)), each groove 44 is designed to have a configuration such that a film 121 of SOG solution formed on the semiconductor chip 41 is interrupted by the upper peripheral edge of each bonding pad 113. The configuration of the groove 44 is optimized by adjusting the width t5 and the depth d5 of the groove 42 and by the film thickness t6 of the in-groove film.

Preferably, the height of each via hole 115 equal to or smaller than the height of the plug 117 and the thickness t6 of the in-groove film. If the via holes 115 are not designed to have such height, the via holes 115 cannot be embedded fully with the plugs 117, resulting in the failure of securing electrical continuity between the wirings 111 and the wirings 112, and between the wirings 111 and the bonding pads 113.

Further, the width t5 of the groove 42 should be greater than the twice of the thickness t6 of the in-groove film (t5>2×t6). If the grooves 42 have a lesser width t5, the grooves 42 are fully embedded with the in-groove film and unable to form grooves 44.

Alternatively, two or more grooves 42 may be formed around each bonding pad 113.

It should be apparent to those skilled in the art that the present invention may be embodied in many other specific forms without departing from the spirit or scope of the invention. Particularly, it should be understood that the invention may be embodied in the following forms:

In each embodiment, the SOG film serving as the flattening insulating film 121 may be replaced with other insulating coating films (e.g., a polyimide resin film and an organic silica film).

In any of the first to fifth embodiments, the wirings 111 may be embedded in the via holes 114 in place of the plugs 116. In any of the first to fourth embodiments, the wirings 112 may be embedded in the via holes 115 in place of the plugs 117.

In any of the third to fifth embodiments, the SOG film serving as the flattening insulating film 121 may be subjected to etchback treatment like in the second embodiment.

In each embodiment, wireless bonding may be employed in place of wire bonding using bonding wires 119. The wireless bonding includes, for example, flip chip method for connecting bonding pads to lead terminals employing solder balls, beam lead method for connecting bonding pads to lead terminals using gold beam leads, TAB (Tape Automated Bonding) method and STD (Semiconductor on Thermoplastic Dielectric) method.

Therefore, the present examples and embodiments are to be considered as illustrative and not restrictive, and the invention is not to be limited to the details given herein, but may be modified within the scope and equivalence of the appended claims.

What is claimed is:

1. A semiconductor device, comprising:

a substrate;

a bonding pad provided over the substrate;

an enclosure provided over the substrate and surrounding the bonding pad, wherein a groove is formed between the bonding pad and the enclosure; and a flattening insulating film formed on a surface of the substrate including the enclosure, the groove, and a peripheral portion of the bonding pad.

2. The semiconductor device according to claim 1, further comprising a protecting film formed over the flattening insulating film.

3. The semiconductor device according to claim 1, further comprising at least one additional enclosure formed over the substrate and surrounding the enclosure, wherein a second groove is formed between the enclosure and the additional enclosure.

4. A semiconductor device, comprising:

a substrate;

a bonding pad provided over the substrate; and an enclosure provided over the substrate and surrounding the bonding pad, wherein a groove is formed between the bonding pad and the enclosure; and wherein, the enclosure and the bonding pad are substantially equivalent in height, the semiconductor device further comprising a flattening insulating film formed over the substrate and within in the groove, the insulating film having a thickness substantially equivalent to the height of the enclosure and the bonding pad.

5. The semiconductor device according to claim 2, further comprising a protecting film formed over the flattening insulating film.

\* \* \* \* \*